(12) United States Patent
Deng

(10) Patent No.: US 10,931,057 B2
(45) Date of Patent: Feb. 23, 2021

(54) WATERPROOF EJECTION MECHANISM FOR A CARD CONNECTOR

(71) Applicant: JUST CONNECTOR (KUNSHAN) CO., LTD, Jiangsu (CN)

(72) Inventor: Hongbo Deng, Jiangsu (CN)

(73) Assignee: JUST CONNECTOR (KUNSHAN) CO., LTD, Jiangsu (CN)

( * ) Notice: Subject to any disclaimer, the term of this patent is extended or adjusted under 35 U.S.C. 154(b) by 42 days.

(21) Appl. No.: 16/348,948

(22) PCT Filed: Nov. 10, 2017

(86) PCT No.: PCT/CN2017/110344
§ 371 (c)(1),
(2) Date: Jul. 31, 2019

(87) PCT Pub. No.: WO2018/086568
PCT Pub. Date: May 17, 2018

(65) Prior Publication Data
US 2019/0379153 A1 Dec. 12, 2019

(30) Foreign Application Priority Data
Nov. 12, 2016 (CN) .......................... 201610998271.X

(51) Int. Cl.
*G06K 13/08* (2006.01)
*H05K 5/02* (2006.01)
(Continued)

(52) U.S. Cl.
CPC ......... *H01R 13/5202* (2013.01); *G06K 13/08* (2013.01); *H01R 13/633* (2013.01);
(Continued)

(58) Field of Classification Search
CPC ............... G06K 13/08; G06K 13/0868; H01R 13/5205; H05K 5/0295; H05K 5/06
See application file for complete search history.

(56) References Cited

U.S. PATENT DOCUMENTS 9,236,681 B2 * 1/2016 Yu ........................ G06K 7/0021
9,281,610 B2 * 3/2016 Ejiri ................... G06K 13/0831
(Continued)

FOREIGN PATENT DOCUMENTS

CN 105098467 A 11/2015
CN 106410507 A 2/2017
(Continued)

OTHER PUBLICATIONS

International Search Report for International application No. PCT/CN2017/110344 dated Jan. 26, 2018.

*Primary Examiner* — Vanessa Girardi
(74) *Attorney, Agent, or Firm* — W&G Law Group LLP

(57) ABSTRACT

A waterproof mechanism includes a telescopic member; a thrusting member; and a sleeve. The telescopic member includes a retractable telescopic base, and an opening provided on an upper end of the telescopic base. The thrusting member includes a head portion and a rod portion having an outer diameter smaller than that of the head portion. The sleeve includes a cavity penetrating through both ends of the sleeve. The sleeve is sleeved on the rod portion of the thrusting member, a part of the thrusting member and a part of the sleeve are inserted into the opening of the telescopic base. The head portion of the thrusting member is held between the telescopic base and the sleeve, and an inner wall surface of an upper portion of the opening of the telescopic base and an outer wall surface of a lower portion of the sleeve are in a waterproof connection.

17 Claims, 6 Drawing Sheets

(51) Int. Cl.
*H01R 13/52* (2006.01)
*H01R 13/633* (2006.01)
*H05K 5/04* (2006.01)
*H01R 12/71* (2011.01)

(52) U.S. Cl.
CPC ............ *H05K 5/0295* (2013.01); *H05K 5/04* (2013.01); *H01R 12/714* (2013.01)

(56) References Cited

U.S. PATENT DOCUMENTS

| | | | |
|---|---|---|---|
| 9,680,243 B2* | 6/2017 | Shimotsu | G06K 13/08 |
| 9,875,432 B2* | 1/2018 | Motohashi | G06K 7/0021 |
| 9,954,328 B2* | 4/2018 | Motohashi | H01R 12/721 |

FOREIGN PATENT DOCUMENTS

| | | |
|---|---|---|
| CN | 106413322 A | 2/2017 |
| CN | 206332247 U | 7/2017 |

* cited by examiner

WATERPROOF EJECTION MECHANISM FOR A CARD CONNECTOR

TECHNICAL FIELD

The present disclosure relates to the field of electrical connector, and particularly, to a waterproof mechanism, a card connector and a metal casing for mobile phones and tablet computers.

BACKGROUND

An electronic card connector of a smart phone is generally used to carry a personal identification card, a memory card, and the like. However, due to factors relating to a service operator or personal preference, the existing card connector is required to allow placing and taking the electronic card from the outside, and a special structure of the card connector causes difficulty in waterproof design.

The existing card connector generally includes a drawer seat for carrying an electronic card. The drawer seat has a tail portion provided with a cover plate configured to fit in a frame side of a mobile phone. The cover plate is provided with a small hole, into which a needle is to be inserted for retracting the card. Another side of the small hole is an end of a push rod of a card retracing mechanism of the card connector. The small hole cannot be blocked, which otherwise causes the difficulty in the waterproof design.

SUMMARY

In view of above, it is necessary to provide a waterproof mechanism, a card connector and a metal casing, aiming to solve the waterproof problem of a portable terminal such as a mobile phone and the like.

In order to solve the above technical problem, the present disclosure provides a waterproof mechanism, including a telescopic member; a thrusting member; and a sleeve. The telescopic member includes a telescopic base that is retractable, and an opening provided on an upper end of the telescopic base. The thrusting member includes a head portion and a rod portion having an outer diameter smaller than that of the head portion, and the sleeve includes a cavity penetrating through both ends of the sleeve. The sleeve is sleeved on the rod portion of the thrusting member, a part of the thrusting member and a part of the sleeve are inserted into the opening of the telescopic base, the head portion of the thrusting member is held between the telescopic base and the sleeve, and an inner wall surface of an upper portion of the opening of the telescopic base and an outer wall surface of a lower portion of the sleeve are in a waterproof connection.

The outer diameter of the head portion of the thrusting member and an outer diameter of the sleeve are smaller than or equal to an inner diameter of the opening of the telescopic member.

An inner diameter of the cavity of the sleeve is greater than or equal to the outer diameter of the rod portion of the thrusting member, and smaller than the outer diameter of the head portion.

The telescopic member further includes an extension portion extending from the telescopic base, and the opening is provided on the extension portion.

A hard material is embedded in the telescopic base.

The waterproof connection between the inner wall surface of the upper portion of the opening of the telescopic base and the outer wall surface of the lower portion of the sleeve is an adhesion using a waterproof glue.

The waterproof connection between the inner wall surface of the upper portion of the opening of the telescopic base and the outer wall surface of the lower portion of the sleeve is achieved by using an elastic rubber as a material at the opening of the telescopic base, such that sealed waterproofness is achieved once by the sleeve is inserted.

In order to solve the above technical problem, the present disclosure further provides a card connector, including: a terminal module; a metal casing; a card-retracting mechanism; a waterproof mechanism; and a card holder. The waterproof mechanism includes a telescopic member, a thrusting member, and a sleeve. The telescopic member includes a telescopic base that is retractable, and an opening provided on an upper end of the telescopic base, the thrusting member includes a head portion and a rod portion having an outer diameter smaller than that of the head portion, and the sleeve includes a cavity penetrating through both ends of the sleeve. The sleeve is sleeved on the rod portion of the thrusting member, a part of the thrusting member and a part of the sleeve are inserted into the opening of the telescopic base, the head portion of the thrusting member is held between the telescopic base and the sleeve, and an inner wall surface of an upper portion of the opening of the telescopic base and an outer wall surface of a lower portion of the sleeve are in a waterproof connection. The card holder is configured to carry an electronic card and move between the metal casing and the terminal module. The card-retracting mechanism includes a push rod mounted on a lateral side of the card connector, the card holder includes a card holder frame and a cover plate located at a top of the card holder frame, a through-hole is provided at a position of the cover plate corresponding to the waterproof mechanism, the telescopic base of the waterproof mechanism cooperates with an end of the push rod, and the through-hole of the cover plate corresponds to the thrusting member.

The sleeve is integrally formed at a position of the through-hole of the cover plate, and a waterproof ring is disposed on an outer edge of the cover plate and cooperates with a slot of the metal casing for waterproofness.

The sleeve is integrally formed on the metal casing, the cavity of the sleeve penetrates the metal casing, and a waterproof ring is disposed on an outer edge of the cover plate of the card holder and cooperates with a slot of the metal casing for waterproofness.

In order to solve the above technical problem, the present disclosure further provides a metal casing, including: a frame portion; a slot penetrating through the frame portion, a card holder being to be inserted through the slot; and a sleeve integrally formed on an inner side of the frame portion. The sleeve is hollow to form a cavity, and the cavity penetrates through the frame portion.

A thrusting member is mounted in the sleeve, a telescopic member is sleeved inside an end of the sleeve, and the sleeve, the thrusting member and the telescopic member form a waterproof mechanism. The telescopic member includes a telescopic base that is retractable, and an opening provided on an upper end of the telescopic base, the thrusting member includes a head portion and a rod portion having an outer diameter smaller than that of the head portion, the sleeve is sleeved on the rod portion of the thrusting member, a part of the thrusting member and a part of the sleeve are inserted into the opening of the telescopic base, the head portion of the thrusting member is held between the telescopic base and the sleeve, and the telescope member, with an inner wall surface of an upper portion of the opening of the telescopic base, is connected to an outer wall surface of the sleeve.

The outer diameter of the head portion of the thrusting member and an outer diameter of the sleeve are smaller than or equal to an inner diameter of the opening of the telescopic member.

An inner diameter of the cavity of the sleeve is greater than or equal to the outer diameter of the rod portion of the thrusting member, and smaller than the outer diameter of the head portion.

The telescopic member further includes an extension portion extending from the telescopic base, and the opening is provided on the extension portion.

A hard material is embedded in the telescopic base.

A waterproof connection between the inner wall surface of the upper portion of the opening of the telescopic base and an outer wall surface of a lower portion of the sleeve is an adhesion using a waterproof glue.

An elastic silica gel or rubber is used as a material at the opening of the telescopic base, and waterproofness is achieved once the sleeve is inserted into the opening of the telescopic base.

In the present disclosure, by means of the waterproof mechanism provided between the card-retracting mechanism and the cover plate, the waterproofness of the through-hole of the cover plate can be achieved by the cooperation among the telescopic member, the thrusting member and the sleeve, without influencing the card-retraction function of the card-retracting mechanism.

BRIEF DESCRIPTION OF DRAWINGS

The accompanying drawings described herein are intended to provide a further understanding of the present disclosure, and belong to a part of the present disclosure. The illustrative embodiments of the present disclosure and description thereof aim to explain the present disclosure, instead of constituting an undue limitation of the present disclosure.

FIG. 1 is a perspective assembled diagram of a waterproof mechanism according to the present disclosure;

FIG. 2 is a perspective exploded diagram of the waterproof mechanism according to the present disclosure;

FIG. 3 is a perspective diagram of a card connector according to the present disclosure;

FIG. 4 is a structural diagram of a part of the card connector fitted to the waterproof mechanism according to the present disclosure;

FIG. 5 is a cross-sectional view taken along a dashed line A-A shown in FIG. 4;

FIG. 6 is a perspective diagram of a metal casing according to the present disclosure, fitted to the card connector, FIG. 7 is a cross-sectional view taken along a dashed line B-B shown in FIG. 6;

FIG. 8 is an exploded view of a waterproof mechanism of a metal casing according to the present disclosure; and FIG. 9 is an enlarged view of a region represented with a dotted circle in FIG. 8.

DESCRIPTION OF EMBODIMENTS

In order to clarify the purposes, technical solutions, and advantages of the present disclosure, the technical solutions of the present disclosure will be clearly and fully described with reference to specific embodiments and accompanying drawings of the present disclosure. It is apparent that the described embodiments are only a part of the embodiments of the present disclosure, rather than all of them. All other embodiments, which are obtained by those skilled in the art based on the disclosed embodiments of the present disclosure without departing from the inventive scope, shall fall within the scope of the present disclosure.

Embodiment 1

Figure 1:
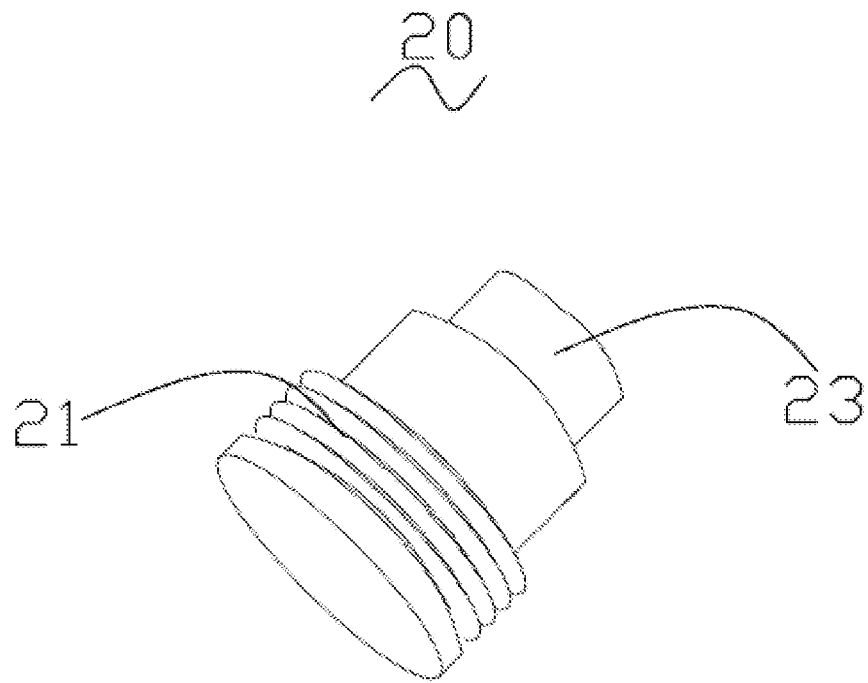
FIG. 1 to FIG. 5 are diagrams of a waterproof mechanism according to Embodiment 1 of the present disclosure and a card connector using the waterproof mechanism.
Figure 2:
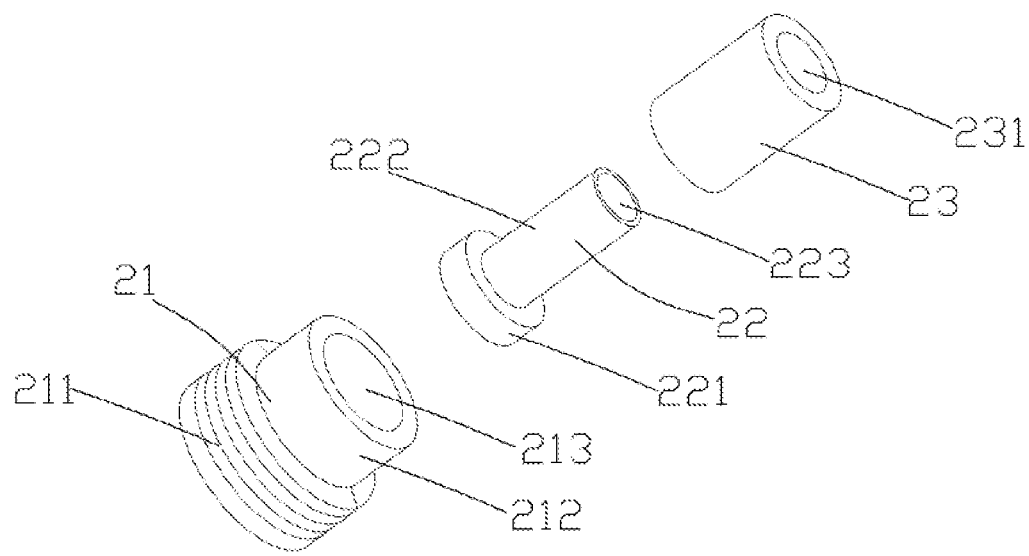
Figure 5:
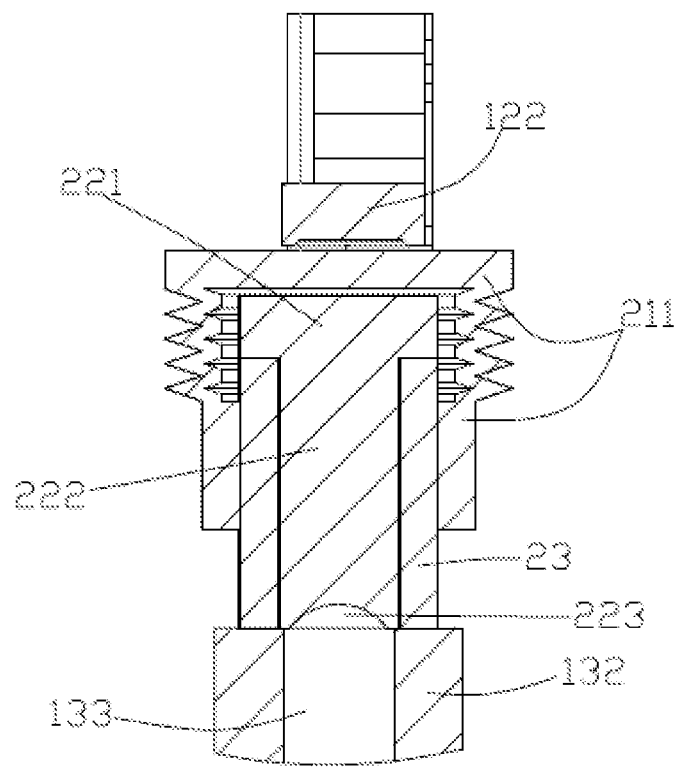
Figure 6:
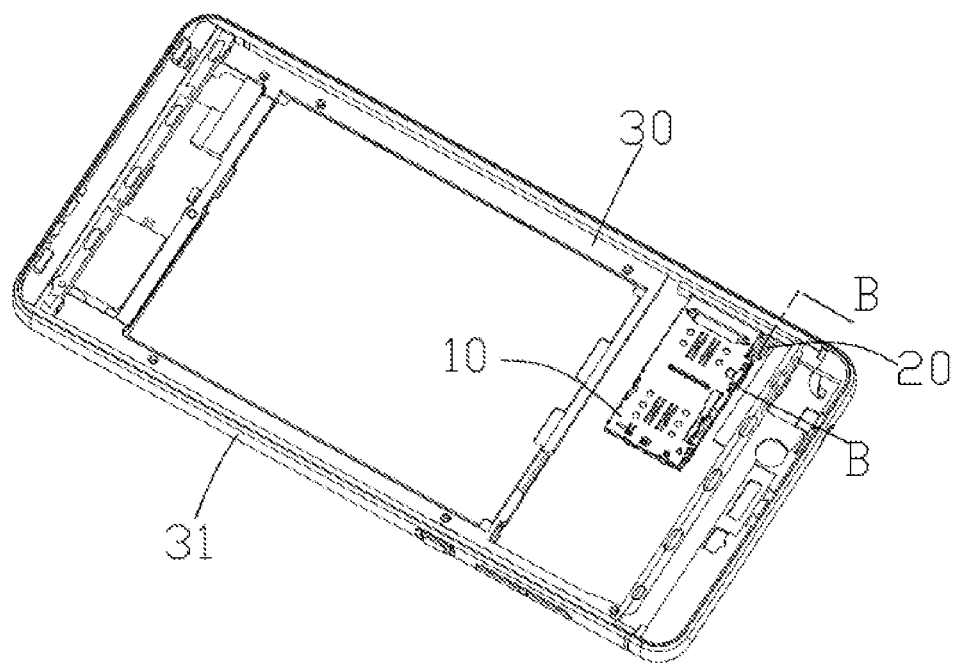
FIG. 6 to FIG. 9 are diagrams of a metal casing according to Embodiment 2 of the present disclosure.
Figure 7:
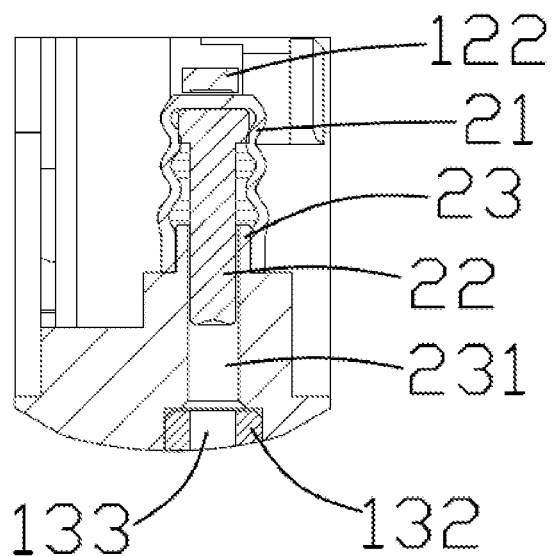
Figure 8:
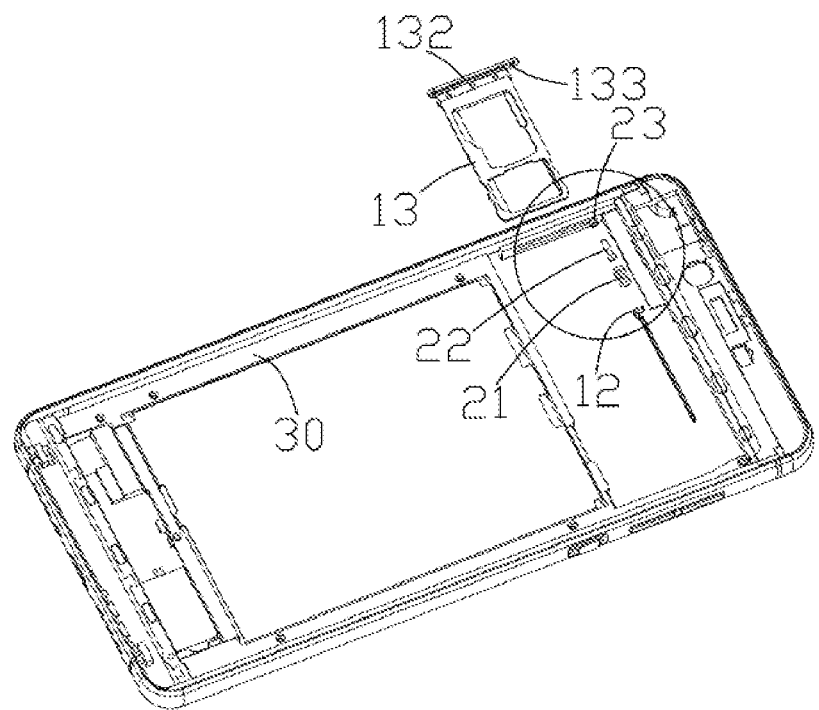
Figure 9:
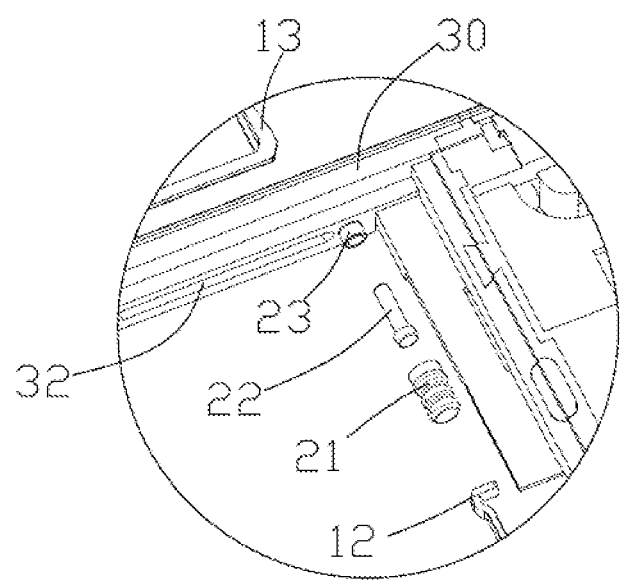

Referring to FIG. 1, FIG. 2 and FIG. 5, a waterproof mechanism 20 according to the present disclosure includes a telescopic member 21, a thrusting member 22, and a sleeve 23.

The telescopic member 21 includes a telescopic base 211 that is retractable along a card-inserting direction, and an extension portion 212 that is formed into one piece with the telescopic base 211. An upper end of the extension portion 212 is provided with an opening 213, and the opening 213 extends from the top of the extension portion 212 to the bottom of the telescopic base 211. The rest of telescopic member 21, except the opening 213, is a closed structure. The telescopic base 211 has a laminated structure. The laminated structure, when being subjected to a thrust, stretches with a stretching length. A metal plate or a hard plastic plate is embedded in the bottom of the telescopic base 211 to protect the telescopic base 211 from being damaged by the thrust.

The thrusting member 22 includes a head portion 221 having a larger outer diameter and a rod portion 222 having an outer diameter smaller than that of the head portion 221. The outer diameter of the head portion 221 is smaller than or equal to an inner diameter of the opening 213 of the telescopic member 21. The rod portion 222 is provided with a recessed portion 223 at its top end. The sleeve 23 is hollow to form a cavity 231, and the cavity 231 penetrates both ends of the sleeve 23. The inner diameter of the opening 213 of the telescopic member 21 and the outer diameter of the head portion 221 of the thrusting member 22 are both larger than an inner diameter of the cavity 231 of the sleeve 23, but smaller than or equal to an outer diameter of the sleeve 23.

Mainly referring to FIG. 2, during assembling, the head portion 221 of the thrusting member 22 is first inserted into the opening 213 of the telescopic member 21, the sleeve 23 is then sleeved on the rod portion 222 of the thrusting member 22, and finally, an inner wall surface of the extension portion 212 of the telescopic member 21 is adhered to an outer wall surface of the sleeve 23 with a waterproof glue or other material. Alternatively, the sleeve 23 is first sleeved on the rod portion 222 of the thrusting member 22, then the sleeve 23 together with the thrusting member 22 are inserted into the opening 213 of the telescopic member 21, and finally, the inner wall surface of the extension portion 212 of the telescopic member 21 is adhered to the outer wall surface of the sleeve 23 with the waterproof glue or other material. The adhesion using the waterproof material herein can adopt a piston-type rubber, such as a syringe principle and the like. In this case, the head portion 221 of the thrusting member 22 is held between the bottom of the telescopic base 211 and the sleeve 23.

Figure 3:
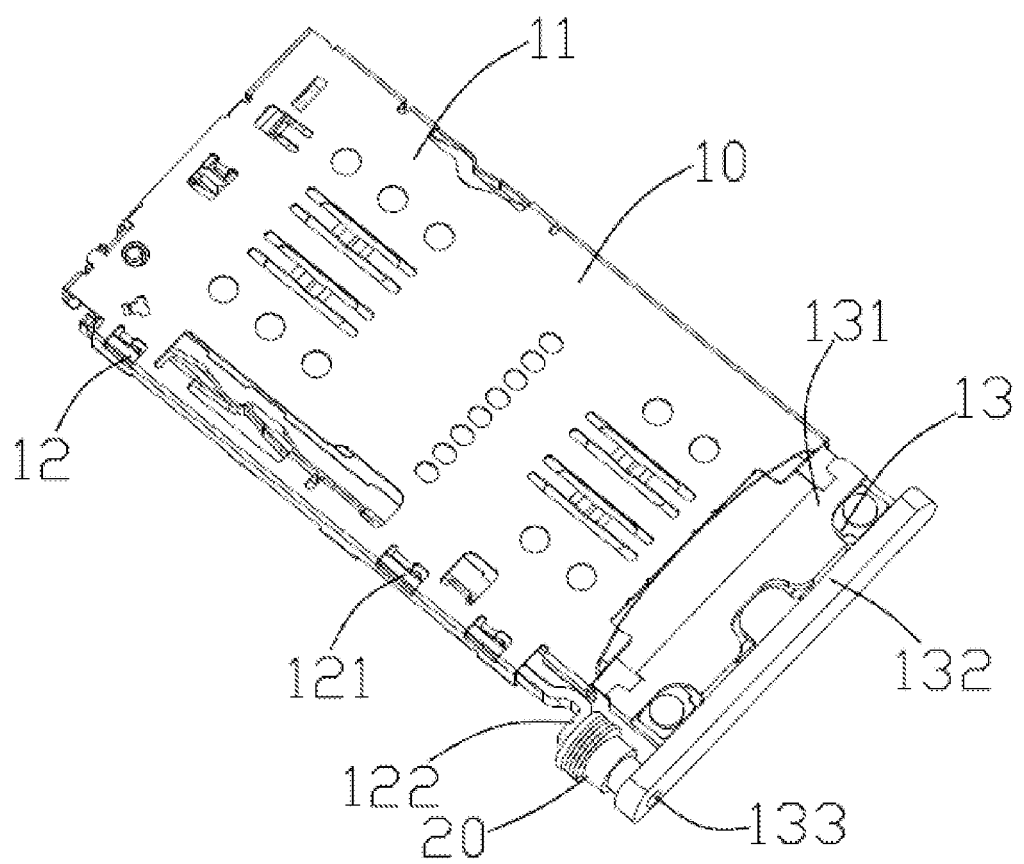
Figure 4:
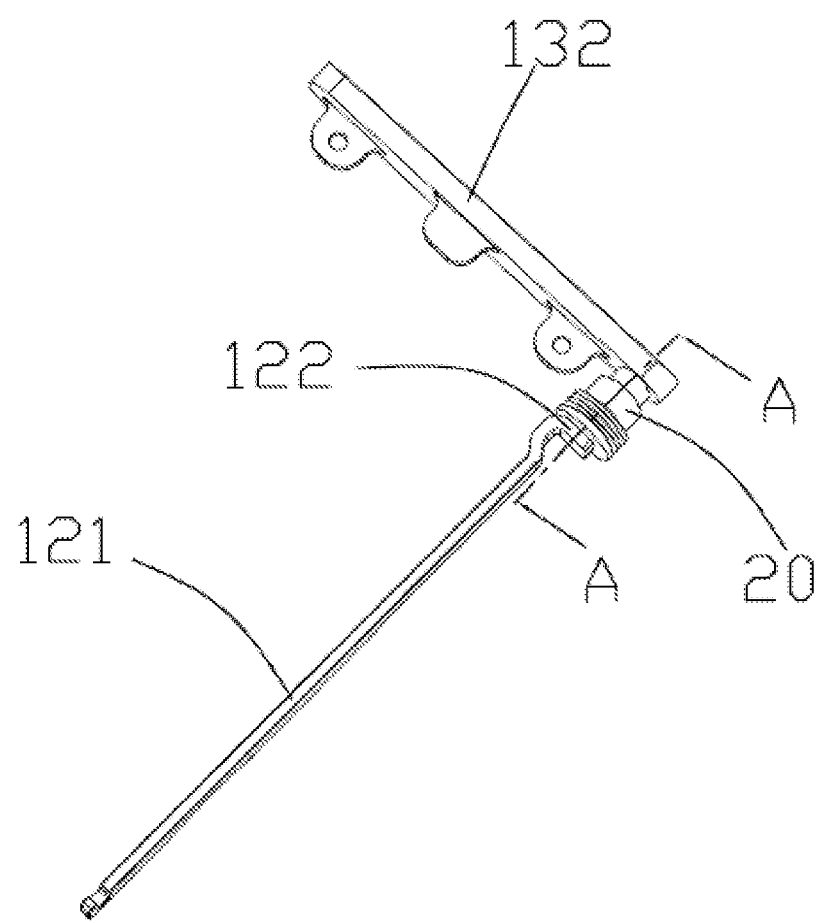

Referring to FIG. 3 to FIG. 5, the card connector 10 according to the present disclosure includes a terminal module (not shown), a metal casing 11, a card-retracting mechanism 12, a card holder 13, and a waterproof mechanism 20. The card holder 13 is configured to carry an electronic card and move between the metal casing 11 and the terminal module. The card card-retracting mechanism 12 includes a push rod 121 mounted on a lateral side of the card connector 10. An end 122 of the push rod 121 cooperates with the telescopic base 211 of the waterproof mechanism 20. The card holder 13 includes a card holder frame 131 and a cover plate 132 located at the top of the card holder frame 131. The cover plate 132 is used for covering and closing a slot provided on a side of a mobile phone middle frame (not shown). At a position of the cover plate 132 corresponding to the waterproof mechanism 20, a through-hole 133 is provided for use in inserting of the card-retracting needle (not shown). The through-hole 133 faces the recessed portion 223 provided at the top end of the rod portion 222 of the thrusting member 22. The through-hole 133 has an inner diameter smaller than the outer diameter of the sleeve 23. A treatment is necessary for forming a waterproof fitting structure between the sleeve 23 and an outer edge of the through-hole of the cover plate 132.

The principle of the card retracing is as follows: the card-retracting needle is inserted through the through-hole 133 to push the thrusting member 22 to move, and the thrusting member 22 causes the stretching of the telescopic base 211 of the telescopic member 21 toward the push rod 121, so as to push the push rod 121 to eject the card. After the card holder 13 is inserted, the push rod 121 moves toward the telescopic member 21, while the telescopic base 211 is restored as a laminated structure.

In the present disclosure, by means of the waterproof mechanism 20 provided between the card-retracting mechanism 12 and the cover plate 132 of the card holder 13, the waterproofness of the through-hole 133 of the cover plate 132 can be achieved by the cooperation among the telescopic member 21, the thrusting member 22 and the sleeve 23, without influencing the card-retraction function of the card-retracting mechanism 12.

Embodiment 2

Referring FIG. 6 to FIG. 9, compared with Embodiment 1, Embodiment 2 mainly relates to a metal casing 30, such as a metal middle frame or a metal housing for a mobile phone or a tablet computer, and the like. The metal casing 30 includes a frame portion 31, and a slot 32 penetrating through the frame portion 31, through which the card holder 13 is to be inserted. Compared with Embodiment 1, the sleeve 23 of the waterproof mechanism 20 according to the present disclosure is integrally formed on an inner side of the frame portion 31 of the metal casing 30, and the cavity 231 of the sleeve 23 is communicated with the frame portion 31. The cavity 231 faces the through-hole 133 of the cover 132 of the card holder 13 to facilitate insertion of the card-retracting needle. In other embodiments, instead of providing the through-hole 133 in the cover plate 132 of the card holder 13, the through-hole 133 can be directly provided at an outer side of the frame portion 31. That is, the card-retracting needle is directly inserted from the outer side of the frame portion 31 and pushes the thrusting member 22 to retract the card.

A waterproof ring is disposed on an outer edge of the cover plate 132 of the card holder 13 and cooperates with the slot 32 to achieve waterproofness.

Embodiment 3

In this embodiment, the sleeve 23 also can be integrally formed at the position of the through-hole of the cover plate 132 of the card holder 13. In this case, a waterproof ring is disposed on the outer edge of the cover plate 132 of the card holder 13 and cooperates with the slot 32 to achieve waterproofness.

Those skilled in the art could understand that embodiments of the present disclosure can be provided as a method, system, or computer program product. Thus, the present disclosure can be embodied in form of a pure hardware, a pure software, or a combination of software and hardware. In addition, the present disclosure can be embodied in form of a computer program product, which is executed on one or more computer-usable storage media (including, but not limited to, disk storage, CD-ROM, optical storage, etc.) including computer usable program code.

It should be understood that the terms "comprise", "include" or any other variants are intended to encompass a non-exclusive inclusion, such that a process, a method, a product, or an apparatus also includes described as including a series of element also includes other elements that are not explicitly listed, or elements that are inherent to such a process, method, product, or apparatus. Without any further limitations, the process, method, product, or apparatus defined by the expression "comprising an element" or "including an element" does not exclude the presence of other equivalent elements.

The above description is a part of embodiments of the present disclosure, rather than limit the scope of the present disclosure. Those skilled in the art understand that the technical solutions of the above embodiments can be modified. Any modification, equivalent substitution, or improvement made without departing from the spirit and principle of the present disclosure shall fall within the protection scope defined by the claims.

What is claimed is:

1. A waterproof mechanism, comprising:
a telescopic member;
a thrusting member; and
a sleeve,
wherein
the telescopic member comprises a telescopic base that is retractable and an opening provided on an upper end of the telescopic base,
the thrusting member comprises a head portion and a rod portion having an outer diameter smaller than an outer diameter of the head portion,
the sleeve comprises a cavity penetrating through ends of the sleeve,
the sleeve is received on the rod portion of the thrusting member,
a part of the thrusting member and a part of the sleeve are inserted into the opening of the telescopic base,
the head portion of the thrusting member is held between the telescopic base and the sleeve, and
an inner wall surface of an upper portion of the opening of the telescopic base and an outer wall surface of a lower portion of the sleeve are in a waterproof connection.

2. The waterproof mechanism according to claim 1, wherein the outer diameter of the head portion of the thrusting member and an outer diameter of the sleeve are smaller than or equal to an inner diameter of the opening of the telescopic member.

3. The waterproof mechanism according to claim 1, wherein an inner diameter of the cavity of the sleeve is greater than or equal to the outer diameter of the rod portion of the thrusting member, and the inner diameter of the cavity of the sleeve is smaller than the outer diameter of the head portion.

4. The waterproof mechanism according to claim 1, wherein the waterproof connection comprises the inner wall surface of the upper portion of the opening of the telescopic base adhesively connected to the outer wall surface of the lower portion of the sleeve using a waterproof glue.

5. The waterproof mechanism according to claim 1, wherein the waterproof connection between the inner wall surface of the upper portion of the opening of the telescopic base and the outer wall surface of the lower portion of the sleeve comprises an elastic rubber material at the opening of the telescopic base, the elastic rubber material being configured to establish waterproofness once the sleeve is inserted.

6. The waterproof mechanism according to claim 1, wherein
the telescopic member comprises an extension portion extending from the telescopic base, and
the opening is provided on the extension portion.

7. The waterproof mechanism according to claim 6, wherein a hard material is embedded in the telescopic base.

8. A metal casing, comprising:
a frame portion;
a slot penetrating through the frame portion, a card holder configured to be inserted through the slot;
a sleeve integrally formed on an inner side of the frame portion;
a thrusting member mounted in the sleeve; and
a telescopic member received outside an end of the sleeve, wherein
the sleeve is hollow to form a cavity and the cavity penetrates through the frame portion,
the sleeve, the thrusting member and the telescopic member form a waterproof mechanism,
the telescopic member comprises a telescopic base that is retractable and an opening provided on an upper end of the telescopic base,
the thrusting member comprises a head portion and a rod portion having an outer diameter smaller than that of the head portion,
the sleeve is received on the rod portion of the thrusting member,
a part of the thrusting member and a part of the sleeve are inserted into the opening of the telescopic base,
the head portion of the thrusting member is held between the telescopic base and the sleeve, and
the telescope member, with an inner wall surface of an upper portion of the opening of the telescopic base, is connected to an outer wall surface of the sleeve.

9. The metal casing according to claim 8, wherein the outer diameter of the head portion of the thrusting member and an outer diameter of the sleeve are smaller than or equal to an inner diameter of the opening of the telescopic member.

10. The metal casing according to claim 8, wherein an inner diameter of the cavity of the sleeve is greater than or equal to the outer diameter of the rod portion of the thrusting member and smaller than the outer diameter of the head portion.

11. The metal casing according to claim 8, comprising a waterproof connection including a waterproof glue adhering the inner wall surface of the upper portion of the opening of the telescopic base to an outer wall surface of a lower portion of the sleeve.

12. The metal casing according to claim 8, comprising an elastic silica gel or rubber material at the opening of the telescopic base, and wherein waterproofness is achieved once the sleeve is inserted into the opening of the telescopic base.

13. The metal casing according to claim 8, wherein the telescopic member comprises an extension portion extending from the telescopic base and the opening is provided on the extension portion.

14. The metal casing according to claim 13, wherein a hard material is embedded in the telescopic base.

15. A card connector for carrying an electronic card and connecting with a portable terminal, comprising:
a metal casing;
a card-retracting mechanism;
a waterproof mechanism; and
a card holder,
wherein
the waterproof mechanism comprises a telescopic member, a thrusting member, and a sleeve,
the telescopic member comprises a telescopic base that is retractable and an opening provided on an upper end of the telescopic base,
the thrusting member comprises a head portion and a rod portion having an outer diameter smaller than an outer diameter of the head portion,
the sleeve comprises a cavity penetrating through ends of the sleeve,
the sleeve is received on the rod portion of the thrusting member,
a part of the thrusting member and a part of the sleeve are inserted into the opening of the telescopic base,
the head portion of the thrusting member is held between the telescopic base and the sleeve,
an inner wall surface of an upper portion of the opening of the telescopic base and an outer wall surface of a lower portion of the sleeve are in a waterproof connection,
the card holder is configured to carry the electronic card and move relative to the metal casing,
the card-retracting mechanism comprises a push rod mounted on a lateral side of the card connector,
the card holder comprises a card holder frame and a cover plate located at a top of the card holder frame,
a through-hole is provided at a position of the cover plate corresponding to the waterproof mechanism,
the telescopic base of the waterproof mechanism cooperates with an end of the push rod, and
the through-hole of the cover plate corresponds to the thrusting member.

16. The card connector according to claim 15, wherein the sleeve is integrally formed at a position of the through-hole of the cover plate, and a waterproof ring is disposed on an outer edge of the cover plate and cooperates with a slot of the metal casing for waterproofness.

17. The card connector according to claim 15, wherein the sleeve is integrally formed on the metal casing, the cavity of the sleeve penetrates the metal casing, and a waterproof ring is disposed on an outer edge of the cover plate of the card holder and cooperates with a slot of the metal casing for waterproofness.

* * * * *